(12) United States Patent
Yamashita et al.

(10) Patent No.: US 11,327,584 B2
(45) Date of Patent: *May 10, 2022

(54) INTEGRATED CIRCUIT AND ELECTRONIC PEN

(71) Applicant: Wacom Co., Ltd., Saitama (JP)

(72) Inventors: Shigeru Yamashita, Saitama (JP); Toshihiko Horie, Saitama (JP); Masamitsu Ito, Saitama (JP)

(73) Assignee: Wacom Co., Ltd., Saitama (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/119,942

(22) Filed: Dec. 11, 2020

(65) Prior Publication Data

US 2021/0096661 A1 Apr. 1, 2021

Related U.S. Application Data

(63) Continuation of application No. 16/438,567, filed on Jun. 12, 2019, now Pat. No. 10,866,657.

(30) Foreign Application Priority Data

Jun. 15, 2018 (JP) .............................. JP2018-114297

(51) Int. Cl.
*G06F 3/038* (2013.01)
*G06F 3/0354* (2013.01)
(Continued)

(52) U.S. Cl.
CPC .......... *G06F 3/038* (2013.01); *G06F 3/03545* (2013.01); *H01L 23/5252* (2013.01);
(Continued)

(58) Field of Classification Search
CPC .... G06F 3/03545; G06F 3/038; G06F 3/0383; H01L 23/5252; H01L 23/5256;
(Continued)

(56) References Cited

U.S. PATENT DOCUMENTS 6,781,433 B2 8/2004 Mori
8,044,712 B2 10/2011 Finocchiaro
(Continued)

FOREIGN PATENT DOCUMENTS

EP 1 365 507 A1 11/2003
EP 2 651 032 A2 10/2013
(Continued)

OTHER PUBLICATIONS

Extended European Search Report, dated Nov. 11, 2019, for European Application No. 19180156.2—1216, 35 pages.
(Continued)

*Primary Examiner* — Stacy Khoo
(74) *Attorney, Agent, or Firm* — Seed IP Law Group LLP

(57) ABSTRACT

An integrated circuit includes a first terminal that is connected to a first end of a first capacitor, the first capacitor being included in a resonant circuit, a second terminal that is connected to a second end of the first capacitor, a plurality of second capacitors connected in parallel between the first and second terminals, and a control circuit which, in operation, changes a capacitance of each of the second capacitors. An electronic pen includes the integrated circuit and a first capacitor having a capacitance that varies based on pressure applied to a nib of the electronic pen.

13 Claims, 4 Drawing Sheets

(51) Int. Cl.
  *H01L 23/525* (2006.01)
  *H01L 23/64* (2006.01)
  *H01L 29/417* (2006.01)
  *H01L 29/94* (2006.01)

(52) U.S. Cl.
  CPC ........ *H01L 23/5256* (2013.01); *H01L 23/645* (2013.01); *H01L 29/417* (2013.01); *H01L 29/94* (2013.01)

(58) Field of Classification Search
  CPC ..... H01L 23/645; H01L 29/417; H01L 29/94; H03H 7/0115
  See application file for complete search history.

(56) References Cited

U.S. PATENT DOCUMENTS 10,866,657 B2 * 12/2020 Yamashita ............ H01L 29/417

| | | |
|---|---|---|
| 2005/0201025 A1 | 9/2005 | Shau |
| 2006/0220149 A1 | 10/2006 | Chen et al. |
| 2007/0103228 A1 | 5/2007 | Chen et al. |
| 2011/0002080 A1 | 1/2011 | Ranta |
| 2011/0227666 A1 | 9/2011 | Manssen et al. |
| 2014/0240298 A1 | 8/2014 | Stern |

FOREIGN PATENT DOCUMENTS

| | | |
|---|---|---|
| EP | 3 528 101 A1 | 8/2019 |
| JP | 6320231 | 5/2018 |
| WO | 2016/056299 | 4/2016 |

OTHER PUBLICATIONS

IXYS Integrated Circuits Division, "Non-volatile Digital Programmable Capacitor," DS-NCD2100-R02, Oct. 17, 2014, 20 pages.

* cited by examiner

INTEGRATED CIRCUIT AND ELECTRONIC PEN

BACKGROUND

Technical Field

The present disclosure relates to an integrated circuit and an electronic pen, and more particularly to an integrated circuit and an electronic pen that transmit pen information by using a resonant circuit.

Background Art

An electronic pen used in an electromagnetic resonance (EMR) input system includes a resonant circuit having a coil and a capacitor (refer, for example, to Japanese Patent No. 6320231 (hereinafter, Patent Document 1) and PCT Patent Publication No. WO 2016/056299 (hereinafter, Patent Document 2)). The coil is excited by a magnetic field that is transmitted from a sensor coil in a position detection device. The capacitor is connected in parallel with the coil. When the resonant circuit enters a magnetic field, an induced electromotive force is generated on the coil so that electric power is stored in the resonant circuit. The electronic pen uses the electric power to transmit pen information including, for example, pen pressure information and side switch information.

Some known methods are used to transmit the pen information. For example, one method is to obtain digital information by turning on and off the supply of a signal to the resonant circuit in accordance with the contents of the pen information and transmit the obtained digital signal as the pen information. Another method is to change the resonant frequency of the resonant circuit in accordance with the contents of the pen information and transmit the displacement of the resonant frequency as the pen information. The resonant frequency of the resonant circuit in the former case and the resonant frequency used as the reference for displacement in the latter case will be hereinafter collectively referred to as the "reference resonant frequency."

In order to permit the position detection device to properly receive the pen information transmitted from the electronic pen, the reference resonant frequency of the resonant circuit needs to be equal to a predetermined standard value. However, a manufacturing error may occur in the inductance of the coil and in the capacitance of the capacitor. Therefore, the reference resonant frequency unavoidably varies at a stage immediately after the assembly of the resonant circuit. In view of the above circumstances, an electronic pen manufacturing process is performed by disposing a plurality of capacitors in parallel, assembling the resonant circuit, measuring the reference resonant frequency, and disconnecting some of the capacitors from the resonant circuit by cutting wires with a laser in accordance with the result of measurement so that the reference resonant frequency turns out to be equal to the predetermined standard value. Disclosed in Patent Document 1 is an example of an electronic pen that permits the above adjustment of the reference resonant frequency.

Incidentally, when wires are to be cut with a laser as described, for example, in Patent Document 1, it is necessary to provide a relatively large wiring region. In recent years, however, it is demanded that a substrate disposed in an electronic pen be reduced in size. Therefore, it is becoming difficult to provide a sufficient wiring region. As a result, demanded is an electronic pen that permits the adjustment of the reference resonant frequency by using a smaller area.

BRIEF SUMMARY

The present disclosure has been made in view of the above circumstances, and provides an integrated circuit and an electronic pen that permit the adjustment of the reference resonant frequency by using a smaller area.

According to a first aspect of the present disclosure, there is provided an integrated circuit including a first terminal, a second terminal, a plurality of second capacitors, and a control circuit. The first terminal is connected to a first end of a first capacitor. The first capacitor and a coil are included in a resonant circuit. The second terminal is connected to a second end of the first capacitor. The second capacitors are connected in parallel between the first and second terminals. The control circuit, in operation, changes a capacitance of each of the second capacitors.

According to the first aspect of the present disclosure, there is provided an electronic pen including the integrated circuit and the resonant circuit. The first capacitor includes a variable-capacitance capacitor which, in operation, varies a capacitance of the variable-capacitance capacitor in accordance with pressure applied to a nib of the electronic pen.

According to a second aspect of the present disclosure, there is provided an integrated circuit including a first terminal, a second terminal, a plurality of second capacitors, a plurality of switches, and a control circuit. The first terminal is connected to a first end of a first capacitor. The first capacitor and a coil are included in a resonant circuit. The second terminal is connected to a second end of the first capacitor. The second capacitors are connected in parallel between the first and second terminals. The switches are disposed in series with the second capacitors, respectively. The control circuit controls an on state and an off state of each of the switches.

According to the second aspect of the present disclosure, there is provided an electronic pen including the integrated circuit and the resonant circuit. The first capacitor includes a variable-capacitance capacitor that varies its capacitance in accordance with pressure applied to a nib of the electronic pen.

The first aspect of the present disclosure makes it possible to change the reference resonant frequency of the resonant circuit by changing the capacitance of each of the second capacitors within the integrated circuit. Therefore, the reference resonant frequency can be adjusted by using a smaller area.

The second aspect of the present disclosure makes it possible to change the reference resonant frequency of the resonant circuit by controlling the on state and the off state of each of the switches within the integrated circuit. Therefore, the reference resonant frequency can be adjusted by using a smaller area.

DETAILED DESCRIPTION OF THE PREFERRED EMBODIMENTS

Embodiments of the present disclosure will now be described in detail with reference to the accompanying drawings.

Figure 1:
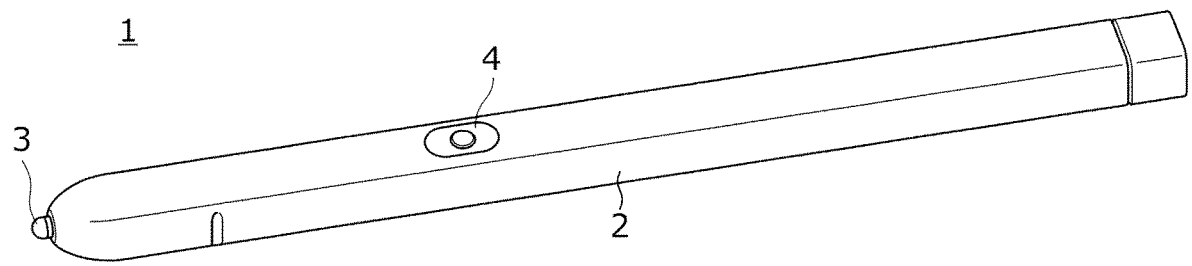
FIG. 1 is a diagram illustrating an external appearance of an electronic pen according to a first embodiment of the present disclosure.

FIG. 1 is a diagram illustrating an external appearance of an electronic pen 1 according to a first embodiment of the present disclosure. As illustrated in FIG. 1, the electronic pen 1 includes a housing 2, a nib member 3, and an operation switch 4. The housing 2 is cylindrically shaped. The nib member 3 is disposed at a longitudinal end of the housing 2. The operation switch 4 is disposed on the surface of the housing 2. The operation switch 4 is called, for example, a side switch when disposed on a lateral surface of the housing 2, and called, for example, a tail switch when disposed on an end of the housing 2.

A user of the electronic pen 1 holds the housing 2 with a user's hand, and inputs information to a position detection device by moving the electronic pen 1 with the nib member 3 placed in contact with a touch surface of the position detection device (not depicted). When the information is inputted, the electronic pen 1 and the position detection device communicate with each other by the aforementioned electromagnetic resonance (EMR) method. This communication permits the electronic pen 1 to transmit pen information including pen pressure information and switch information. The pen pressure information indicates the pressure (pen pressure) applied to the nib member 3.

The switch information indicates the on/off state of the operation switch 4. The electronic pen 1 changes the resonant frequency of a resonant circuit in accordance with the contents of the pen information, and transmits the displacement of the resonant frequency as the pen information.

Figure 2:
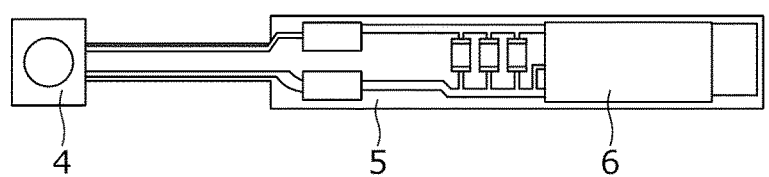
FIG. 2 is a photograph illustrating a top view of a substrate disposed in a housing depicted in FIG. 1.
Figure 3:
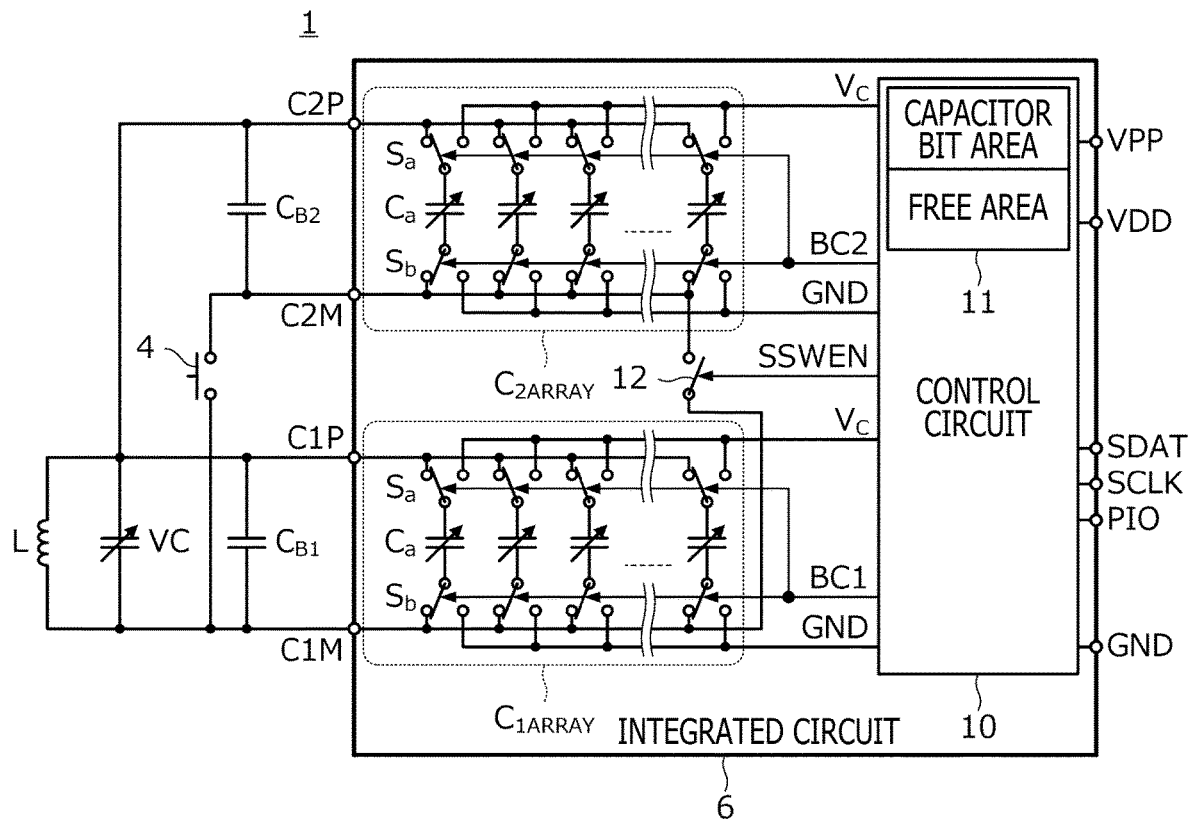
FIG. 3 is a diagram illustrating a circuit configuration of the electronic pen and an integrated circuit in accordance with the first embodiment of the present disclosure.

FIG. 2 is a photograph illustrating a top view of a substrate 5 disposed in the housing 2 depicted in FIG. 1. As illustrated in the photograph, the operation switch 4, which is depicted in FIG. 1 as well, an integrated circuit 6, and wires connecting them are disposed on the surface of the substrate 5. FIG. 3 is a diagram illustrating a circuit configuration of the electronic pen 1 and the integrated circuit 6. As illustrated in FIG. 3, the electronic pen 1 further includes a variable-capacitance capacitor VC (first capacitor), fixed-capacitance capacitors CB1 and CB2, and a coil L. Although described in detail later, the variable-capacitance capacitor VC, the fixed-capacitance capacitors CB1 and CB2, and the coil L form the resonant circuit of the electronic pen 1.

The variable-capacitance capacitor VC varies its capacitance in accordance with pen pressure applied to the nib member 3. The fixed-capacitance capacitors CB1 and CB2 are respectively connected in parallel with the variable-capacitance capacitor VC in order to adjust a reference resonant frequency of the resonant circuit of the electronic pen 1 at the stage of design.

Problems to be solved by the present disclosure will now be described in detail with reference to FIG. 8.

Figure 8:
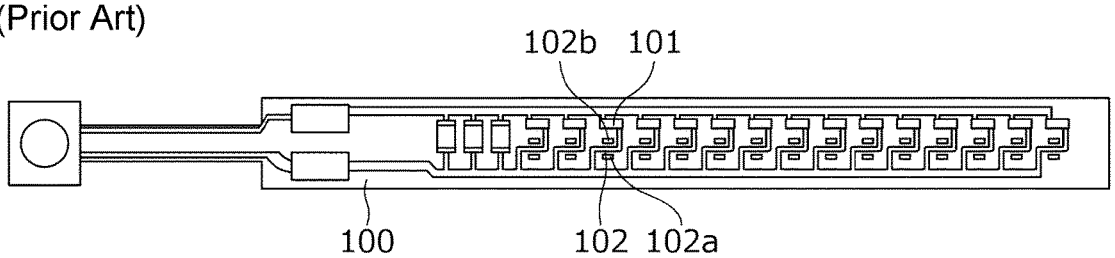
FIG. 8 is a photograph illustrating a top view of a substrate disposed in a housing of an electronic pen according to a background art of the present disclosure.

FIG. 8 is a photograph illustrating a top view of a substrate 100 disposed in a housing of an electronic pen according to a background art of the present disclosure. As illustrated in FIG. 8, a plurality of capacitors 101 and a plurality of cut portions 102 are disposed on the surface of the substrate 100. The cut portions 102 are respectively disposed in series with the capacitors 101. The capacitors 101 are respectively disposed in parallel with variable-capacitance capacitors (not depicted). The capacitors 101 and a coil (not depicted) form a resonant circuit of the electronic pen according to the background art of the present disclosure.

The cut portions 102 are formed of linear wires. Land patterns 102a and 102b, which are isolated wires, are disposed on opposing sides of the cut portions 102. When the cut portions 102 are to be cut with a laser, the irradiation point of the laser is moved from one of the land patterns 102a and 102b to the other. The land patterns 102a and 102b are disposed to reduce the depression of the substrate 100 (refer to Patent Document 1 for details). When the cut portions 102 are cut off, the associated capacitor 101 is disconnected from the resonant circuit to decrease the combined capacitance of the resonant circuit and thus increase the reference resonant frequency. Therefore, a desired reference resonant frequency can be obtained by cutting off a required number of cut portions 102.

However, the electronic pen depicted in FIG. 8 requires a large area in order to dispose the plurality of capacitors 101 and the plurality of cut portions 102. This makes it difficult to reduce the size the substrate 100. As mentioned earlier, it is demanded in recent years that the size of a substrate to be disposed in an electronic pen be reduced. Thus, demanded is a method of adjusting the reference resonant frequency by using a smaller area. The electronic pen 1 according to the present embodiment uses the integrated circuit 6, which includes a circuit for adjusting the reference resonant frequency of the resonant circuit, instead of the plurality of capacitors 101 and the plurality of cut portions 102, and thus permits the adjustment of the reference resonant frequency, as depicted in FIG. 2, by using a smaller area than the electronic pen depicted in FIG. 8. A concrete configuration of the integrated circuit 6 will be described in detail below with reference to FIG. 3.

As illustrated in FIG. 3, the integrated circuit 6 includes a control circuit 10, a switch 12, two capacitor arrays $C_{1ARRAY}$ and $C_{2ARRAY}$, terminals C1P, C1M, C2P, and C2M, a power supply terminal VPP, a power supply terminal VDD, a ground terminal GND, a data terminal SDAT, a clock terminal SCLK, and an auxiliary terminal PIO. The control circuit 10 includes a memory 11. The terminals C1P, C1M, C2P, and C2M are connected to the resonant circuit. The power supply terminal VPP is a terminal to which a potential VPP is supplied. The power supply terminal VDD is a terminal to which a potential VDD (<VPP) is supplied. The ground terminal GND is a terminal to which a ground potential GND (<VDD) is supplied. The data terminal SDAT is a terminal to which data SDA is supplied. The clock terminal SCLK is a terminal to which an operating clock SCLK for the control circuit 10 is supplied. It is preferable that the above terminals included in the integrated circuit 6 comply with the I²C standard, which is a serial bus standard.

First of all, as regards the outside of the integrated circuit 6, one end of the variable-capacitance capacitor VC, one end of each of the fixed-capacitance capacitors $C_{B1}$ and $C_{B2}$, and one end of the coil L are commonly connected to the terminal C1P. The terminal C2P is short-circuited to the terminal C1P at the outside of the integrated circuit 6. The other end of the variable-capacitance capacitor VC, the other end of the fixed-capacitance capacitor CB1, the other end of the coil L, and one end of the operation switch 4 are commonly connected to the terminal C1M. The other end of the fixed-capacitance capacitor CB2 and the other end of the operation switch 4 are commonly connected to the terminal C2M.

For the sake of explanation, let us assume that there is an open circuit, in the integrated circuit 6, between the terminals C1P and C1M and between the terminals C2P and C2M. If the operation switch 4 is off in this case, the variable-capacitance capacitor VC and the fixed-capacitance capacitor CB1 are connected in parallel with the coil L. Thus, a resonant circuit is formed by the coil L and the combined capacitance of these capacitors. This resonant circuit may be hereinafter referred to as the "first resonant circuit." As the variable-capacitance capacitor VC is included in the first resonant circuit, the resonant frequency of the first resonant circuit varies with the pen pressure. Therefore, using the first resonant circuit makes it possible to transmit the pen pressure as the displacement of the resonant frequency.

Meanwhile, if the operation switch 4 is on, the variable-capacitance capacitor VC and the fixed-capacitance capacitors CB1 and CB2 are connected in parallel with the coil L. Thus, a resonant circuit is formed by the coil L and the combined capacitance of these capacitors. This resonant circuit may be hereinafter referred to as the "second resonant circuit." As the variable-capacitance capacitor VC is included in the second resonant circuit, the resonant frequency of the second resonant circuit also varies with the pen pressure. Therefore, using the second resonant circuit also makes it possible to transmit the pen pressure as the displacement of the resonant frequency.

Additionally, as the second resonant circuit is obtained by adding the fixed-capacitance capacitor CB2 to the first resonant circuit, the second resonant circuit differs from the first resonant circuit in the range of resonant frequency displacement based on the pen pressure. Therefore, the switch information can be transmitted as the displacement of the resonant frequency by switching between the first and second resonant circuits in accordance with the on/off state of the operation switch 4.

Next, as regards the inside of the integrated circuit 6, the capacitor array $C_{1ARRAY}$ includes a plurality of capacitors $C_a$ (second capacitors), a plurality of switches $S_a$ (first switches), and a plurality of switches $S_b$ (second switches). The capacitors $C_a$ are connected in parallel between the terminals C1P and C1M. The switches $S_a$ are respectively disposed for the capacitors $C_a$. The switches $S_b$ are respectively disposed for the capacitors $C_a$. As the capacitors $C_a$ are each connected in parallel between the terminals C1P and C1M, the capacitor array $C_{1ARRAY}$ forms a part of the first resonant circuit and a part of the second resonant circuit.

Meanwhile, the capacitor array $C_{2ARRAY}$ includes a plurality of capacitors $C_a$ (second capacitors), a plurality of switches $S_a$ (first switches), and a plurality of switches $S_b$ (second switches). The capacitors $C_a$ are connected in parallel between the terminals C2P and C2M. The switches Sa are respectively disposed for the capacitors $C_a$. The switches $S_b$ are respectively disposed for the capacitors $C_a$. As the capacitors $C_a$ are each connected in parallel between the terminals C2P and C2M, the capacitor array $C_{2ARRAY}$ forms a part of the second resonant circuit.

Figure 4:
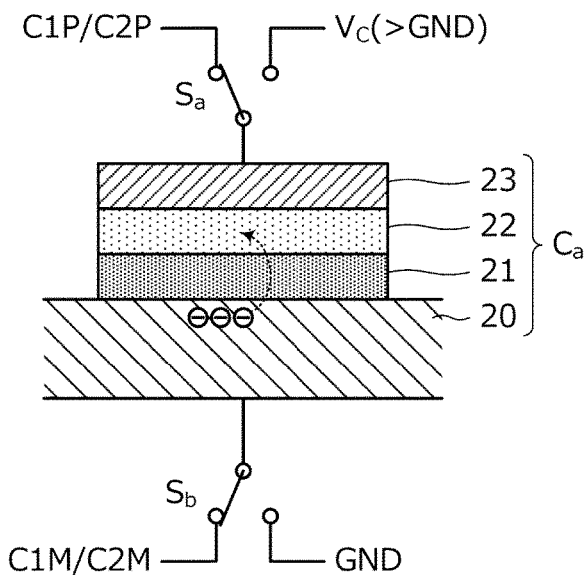
FIG. 4 is a schematic cross-sectional view illustrating a capacitor depicted in FIG. 3.

FIG. 4 is a schematic cross-sectional view illustrating the capacitors $C_a$. As illustrated in FIG. 4, each of the capacitors $C_a$ is structured so that an insulating film 21, a floating gate 22, and a gate electrode 23 are sequentially stacked over a substrate 20 in the order named. This structure is similar to that of a floating-gate flash memory, but differs from that of a flash memory in that the inclusion of a source and a drain is optional. Although not depicted, like structures are disposed on the substrate 20 at predetermined intervals to respectively form the capacitors $C_a$.

The substrate 20 is formed of an n-type semiconductor such as a silicon substrate doped with an n-type impurity. The insulating film 21 is formed of an insulating material such as silicon oxide or silicon nitride. The gate electrode 23 is formed of a conductive material such as conductive metal.

The floating gate 22 is formed of an n-type semiconductor such as polysilicon doped with an n-type impurity. However, at a stage before the adjustment of resonant frequency, the floating gate 22 is to be not electrically charged due to depletion. Therefore, when the capacitance of the capacitors $C_a$ is $C_O$ at a stage before the adjustment of the reference resonant frequency, $C_O$ is expressed by Equation (1) below. However, $C_{OX}$ is the capacitance of the insulating film 21.

$$C_O = C_{OX} \tag{1}$$

The switches $S_a$ each include a common terminal, a first selection terminal, and a second selection terminal. The common terminal is connected to the gate electrode 23 of the associated capacitor $C_a$. The first selection terminal is connected to the terminal C1P or the terminal C2P. The second selection terminal is a terminal to which a potential $V_c$ is supplied. Similarly, the switches $S_b$ each include a common terminal, a first selection terminal, and a second selection terminal. The common terminal is connected to the substrate 20 (so-called a back gate) of the associated capacitor $C_a$. The first selection terminal is connected to the terminal C1M or the terminal C2M. The second selection terminal is a terminal to which the ground potential GND is supplied. In the present embodiment, the potential $V_c$ is higher than the ground potential GND. In an initial state, the switches $S_a$ and $S_b$ are such that the common terminal and the first selection terminal are connected.

Returning to FIG. 3, the control circuit 10 has two functions. One function of the control circuit 10 is to change the reference resonant frequencies of the first and second resonant circuits by changing the capacitance of each capacitor $C_a$ in the capacitor array $C_{1ARRAY}$ in accordance with a control signal BC1 based on an instruction from an external device (not depicted). The other function is to change the reference resonant frequency of the second resonant circuit by changing the capacitance of each capacitor $C_a$ in the capacitor array $C_{2ARRAY}$ in accordance with a control signal BC2 based on an instruction from the external device (not depicted).

More specifically, the memory 11 in the control circuit 10 has a capacitor bit area that stores a value indicating whether or not the capacitance of each capacitor $C_a$ is to be changed from an initial value (a value expressed by Equation (1) above). The value indicating whether or not such a change is to be made is written into the capacitor bit area by the external device (not depicted) through the use of the aforementioned data SDAT. Based on the value stored in the capacitor bit area, the control circuit 10 generates the control signals BC1 and BC2 and supplies the generated control signals BC1 and BC2 to the capacitor arrays $C_{1ARRAY}$ and $C_{2ARRAY}$.

Further, the control circuit 10 has a function of generating the potential $V_c$ in accordance with the potential VPP or the potential VDD, which are supplied from the external device (not depicted). At the beginning of a reference resonant frequency change, the control circuit 10 starts supplying the potential $V_c$, which is generated as described above, to the second selection terminal of each switch $S_a$, and starts supplying the ground potential GND, which is supplied from the external device (not depicted), to the second selection terminal of each switch $S_b$.

When applying a reference resonant frequency change, for the capacitors $C_a$ that are included in the capacitor array $C_{1ARRAY}$ and are to be subjected to a capacitance change from the initial value in accordance with a value stored in the capacitor bit area, the control circuit 10 generates the control signal BC1 for switching each of the associated switches $S_a$ and $S_b$ to the second selection terminal, and supplies the generated control signal BC1 to the associated switches $S_a$ and $S_b$. Then, in a predetermined period of time, the control circuit 10 generates the control signal BC1 for switching each of the associated switches $S_a$ and $S_b$ to the first selection terminal, and supplies the generated control signal BC1 to the associated switches $S_a$ and $S_b$.

Further, for the capacitors $C_a$ that are included in the capacitor array $C_{2ARRAY}$ and are to be subjected to a capacitance change from the initial value in accordance with a value stored in the capacitor bit area, the control circuit 10 generates the control signal BC2 for switching each of the associated switches $S_a$ and $S_b$ to the second selection terminal, and supplies the generated control signal BC2 to the associated switches $S_a$ and $S_b$. Then, in a predetermined period of time, the control circuit 10 generates the control signal BC2 for switching each of the associated switches $S_a$ and $S_b$ to the first selection terminal, and supplies the generated control signal BC2 to the associated switches $S_a$ and $S_b$.

When the control circuit 10 generates and supplies the control signals BC1 and BC2 as described above, the potential $V_c$ is applied for a predetermined period of time to the capacitors $C_a$ that are to be subjected to a capacitance change from the initial value in accordance with a value stored in the capacitor bit area.

Referring again to FIG. 4, while the potential $V_c$ is being applied, electrons existing in the substrate 20 are attracted to the vicinity of the boundary of the insulating film 21, and partly moved into the floating gate 22 due to tunnel effect. The electrons accumulated in the floating gate 22 in the above manner remain in the floating gate 22 even after the application of the potential $V_c$ terminates. That is, the floating gate 22 is in an electrically charged state. As a result, a depletion layer is formed in the floating gate 22. Thus, when a capacitance of the depletion layer is $C_D$, the capacitance of the capacitors $C_a$ changes to a value $C_1$ expressed by Equation (2) below. As is understandable from Equation (2), the value $C_1$ corresponds to the series connection between the capacitance $C_{OX}$ of the insulating film 21 and the capacitance $C_D$ of the depletion layer. In the above manner, the control signals BC1 and BC2 change the capacitance of the capacitors $C_a$. The capacitance $C_D$ of the depletion layer changes in accordance with a change in the width of the depletion layer. Eventually, however, the capacitance $C_D$ of the depletion layer can be steadily fixed when the floating gate 22 is completely depleted by injecting sufficient electric charge into it. Consequently, it is preferable that the potential $V_c$ be applied continuously until the floating gate 22 is completely depleted.

$$C_1 = \frac{C_{OX} \cdot C_D}{C_{OX} + C_D} \qquad (2)$$

As mentioned earlier, the capacitor array $C_{1ARRAY}$ forms a part of the first resonant circuit and a part of the second resonant circuit. Therefore, when electrons are injected individually into the floating gate 22 of each capacitor $C_a$ in the capacitor array $C_{1ARRAY}$ in the above manner in order to individually change the capacitance of each capacitor $C_a$, the reference resonant frequencies of the first and second resonant circuits are changed.

Further, as mentioned earlier, the capacitor array $C_{2ARRAY}$ forms a part of the second resonant circuit. Therefore, the reference resonant frequency of the second resonant circuit can also be changed by injecting electrons individually into the floating gate 22 of each capacitor $C_a$ in the capacitor array $C_{2ARRAY}$ and thus changing the capacitance of each capacitor $C_a$ on an individual basis.

The external device (not depicted) has three functions. A first function of the external device is to measure the reference resonant frequency of the electronic pen 1 in a case where the operation switch 4 is off and in a case where the operation switch 4 is on. A second function is to determine, based on the difference between the measured reference resonant frequency and a standard value, whether or not the capacitance of each capacitor $C_a$ included in the capacitor arrays $C_{1ARRAY}$ and $C_{2ARRAY}$ is to be changed from the initial value. A third function is to write a value indicative of the result of determination in the capacitor bit area of the memory 11. Consequently, when the control circuit 10 exercises control as described above, the reference resonant frequencies of the first and second resonant circuits are adjusted to standard values.

Other processes performed by the control circuit 10 will now be described. The control circuit 10 additionally has a control function of enabling or disabling the operation switch 4 in accordance with an instruction that is supplied from the external device through the use of the aforementioned data SDAT. More specifically, the switch 12 is initially connected between the terminal C1M and the terminal C2M. When instructed to disable the operation switch 4, the control circuit 10 generates an enable signal SSWEN for turning on the switch 12, and supplies the enable signal SSWEN to the switch 12. The terminals C1M and C2M are then short-circuited in the integrated circuit 6 to disable the operation switch 4. When instructed to enable the operation switch 4, the control circuit 10 generates an enable signal SSWEN for turning off the switch 12, and supplies the enable signal SSWEN to the switch 12. The terminals C1M and C2M are then disconnected from each other in the integrated circuit 6 to enable the operation switch 4.

Further, a free area in the memory 11 stores pen identification (ID) and other information for distinguishing the electronic pen 1 from another electronic pen. The information to be stored in the free area is also written by the external device (not depicted) through the use of the aforementioned data SDAT. The electronic pen 1 may transmit a pen ID stored in the free area of the memory 11 to the position detection device as part of the pen information. This permits the position detection device to perform processing that varies from one electronic pen 1 to another (e.g., a process for choosing a different drawing color for each electronic pen 1).

As described above, the integrated circuit 6 and the electronic pen 1 according to the present embodiment make it possible to change the reference resonant frequencies of the first and second resonant circuits by changing the capacitance of each of the capacitors $C_a$ in the integrated circuit 6. Consequently, as is obvious from the comparison between FIGS. 2 and 8, the reference resonant frequencies can be adjusted by using a smaller area than when wires are to be cut with a laser.

The present embodiment has been described on the assumption that the floating gate 22 is formed of an n-type semiconductor. Alternatively, however, the floating gate 22 may be formed of a p-type semiconductor such as polysilicon doped with a p-type impurity. A description is given below with reference to FIG. 5.

Figure 5:
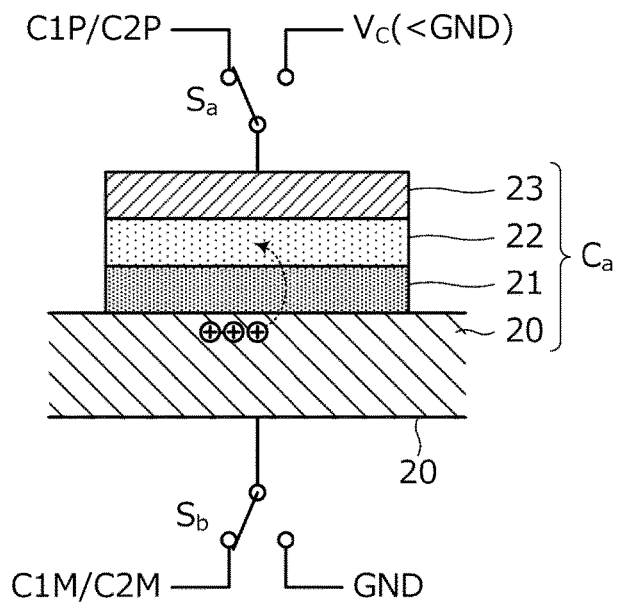
FIG. 5 is a schematic cross-sectional view illustrating the capacitor according to a modified example of the first embodiment of the present disclosure.

FIG. 5 is a schematic cross-sectional view illustrating the capacitors Ca according to a modified example of the first embodiment of the present disclosure. The example depicted in FIG. 5 differs from the example depicted in FIG. 4 in that the substrate 20 is formed of a silicon substrate (p-type semiconductor) doped with a p-type impurity, and that the floating gate 22 is formed of polysilicon (p-type semiconductor) doped with a p-type impurity, and further that the potential Vc is lower than the ground potential GND.

When the potential $V_c$ is applied for the predetermined period of time as described above to the capacitors $C_a$ according to the example of FIG. 5, holes (electron holes) existing in the substrate 20 are attracted to the vicinity of the boundary of the insulating film 21, and partly moved into the floating gate 22 due to tunnel effect. The holes accumulated in the floating gate 22 in the above manner remain in the floating gate 22 even after the application of the potential $V_c$ terminates. Therefore, the floating gate 22 is depleted. Consequently, as is the case with the capacitors Ca in the example of FIG. 4, the control circuit 10 is able to change the capacitance of the capacitors $C_a$. Furthermore, in the example of FIG. 5, it is preferable that the potential $V_c$ be applied continuously until the floating gate 22 is completely depleted in order to stabilize the capacitance of the depletion layer.

A second embodiment of the present disclosure will now be described. The second embodiment differs from the first embodiment in that the reference resonant frequency of the resonant circuit is changed by controlling the on/off states of a plurality of switches connected in series with a plurality of capacitors respectively without changing the capacitance of each of the capacitors. In the other respects, the second embodiment is similar to the first embodiment. Therefore, the same elements are designated by the same reference numerals. The following description deals with the difference of the second embodiment from the first embodiment.

Figure 6:
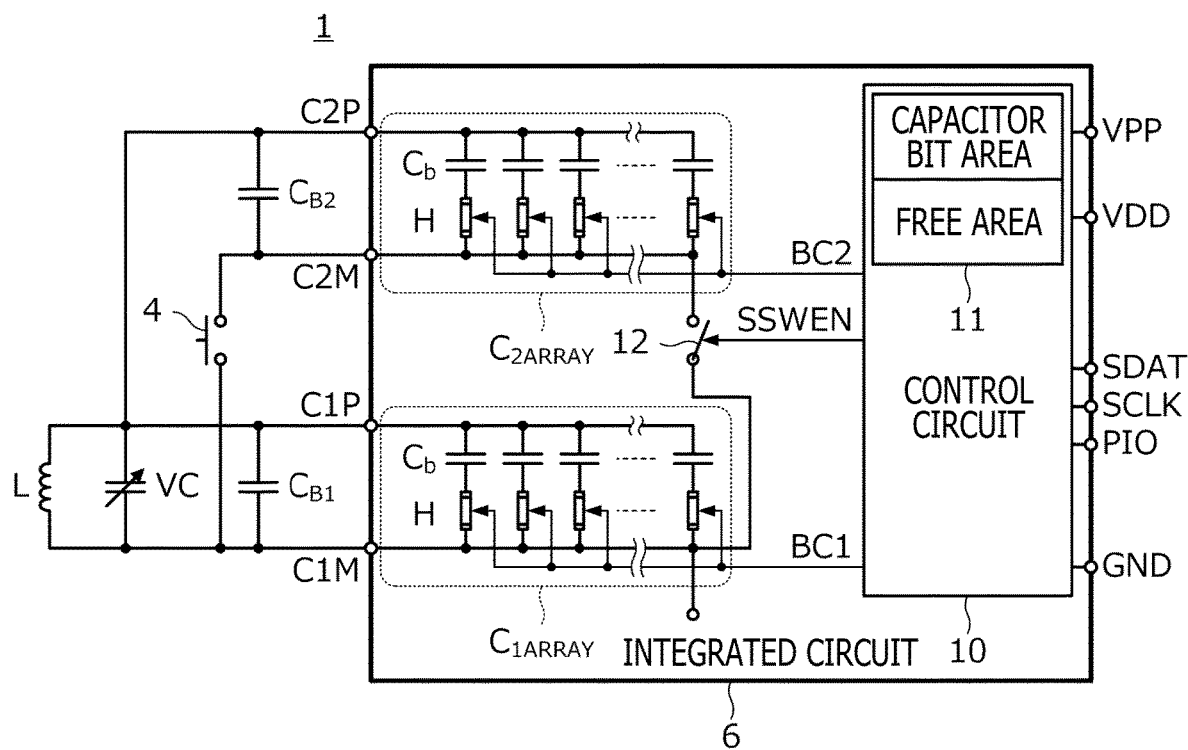
FIG. 6 is a diagram illustrating a circuit configuration of the electronic pen and the integrated circuit in accordance with a second embodiment of the present disclosure.

FIG. 6 is a diagram illustrating a circuit configuration of the electronic pen 1 and the integrated circuit 6 according to the second embodiment. As illustrated in FIG. 6, the capacitor array $C_{1ARRAY}$ according to the present embodiment includes a plurality of capacitors $C_b$ (second capacitors) and a plurality of fuse elements H (switches). The capacitors $C_b$ are connected in parallel between the terminals C1P and C1M. The fuse elements H are respectively connected in series with the capacitors $C_b$. Meanwhile, the capacitor array $C_{2ARRAY}$ according to the present embodiment includes a plurality of capacitors $C_b$ (second capacitors) and a plurality of fuse elements H (switches). The capacitors $C_b$ are connected in parallel between the terminals C2P and C2M. The fuse elements H are respectively connected in series with the capacitors $C_b$. At a stage before resonant frequency adjustment, each of the fuse elements H is in a connected state.

The capacitor bit area provided in the memory 11 according to the present embodiment stores a value indicating whether each fuse element H is to be placed in an on state or in an off state. This value is written into the capacitor bit area by the external device (not depicted) through the use of the aforementioned data SDAT.

The control circuit 10 according to the present embodiment changes the resonant frequencies of the first and second resonant circuits by controlling the on/off state of each of the fuse elements H in accordance with a value stored in the capacitor bit area.

More specifically, for the fuse elements H that are included in the capacitor array $C_{1ARRAY}$ and are to be turned off in accordance with a value stored in the capacitor bit area, the control circuit 10 generates and supplies the control signal BC1 for cutting. Then, the fuse elements H to be turned off in accordance with a value stored in the capacitor bit area are cut to disconnect the associated capacitors $C_b$ from a circuit. As a result, the reference resonant frequencies of the first and second resonant circuits are changed.

Meanwhile, for the fuse elements H that are included in the capacitor array $C_{2ARRAY}$ and are to be turned off in accordance with a value stored in the capacitor bit area, the control circuit 10 generates and supplies the control signal BC2 for cutting. Then, the fuse elements H to be turned off in accordance with a value stored in the capacitor bit area are cut to disconnect the associated capacitors $C_b$ from a circuit. As a result, the reference resonant frequency of the second resonant circuit is changed.

As described above, the integrated circuit 6 and the electronic pen 1 according to the present embodiment make it possible to change the reference resonant frequencies of the first and second resonant circuits by controlling the on/off states of the fuse elements H in the integrated circuit 6. Consequently, the reference resonant frequencies can be adjusted by using a smaller area than when wires are to be cut with a laser.

The present embodiment has been described on the assumption that the fuse elements H are used as switches disposed in series with the capacitors $C_b$ respectively. Alternatively, however, different types of switches may be used. For example, anti-fuse elements may alternatively be used as the switches. Another alternative is to use a switch capable of repeatedly switching between the on and off states instead of using fuse elements, anti-fuse elements, or other switches capable of controlling the on/off state only once. For example, a micro electro mechanical systems (MEMS) switch, such as a MEMS cantilever, may be used. When a voltage is applied to the MEMS cantilever, it is capable of switching between the on and off states.

A third embodiment of the present disclosure will now be described. The third embodiment differs from the first embodiment in that the pen information to be transmitted is based on the difference in resonant frequency instead of the resonant frequencies of resonant circuits in the electronic pen 1, and that the capacitance of a variable-capacitance capacitor can be changed. In the other respects, the third embodiment is similar to the first embodiment. Therefore, the same elements are designated by the same reference numerals. The following description deals with the difference of the third embodiment from the first embodiment.

Figure 7:
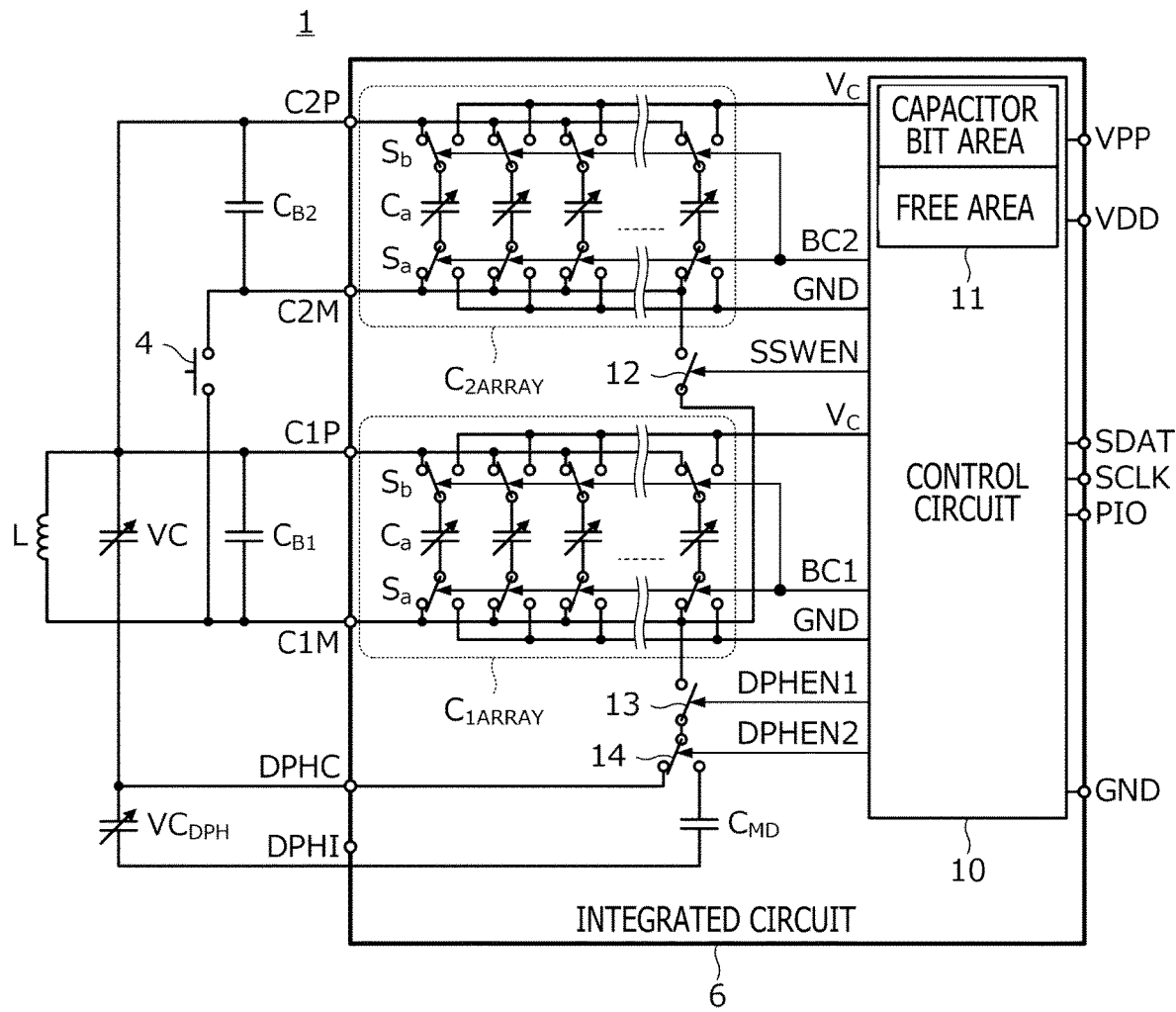
FIG. 7 is a diagram illustrating a circuit configuration of the electronic pen and the integrated circuit in accordance with a third embodiment of the present disclosure.

FIG. 7 is a diagram illustrating a circuit configuration of the electronic pen 1 and the integrated circuit 6 according to the third embodiment. As illustrated in FIG. 7, the electronic pen 1 according to the present embodiment additionally includes a variable-capacitance capacitor $VC_{DPH}$. As is the case with the variable-capacitance capacitor VC, the variable-capacitance capacitor $VC_{DPH}$ varies its capacitance in accordance with pen pressure applied to the nib member 3 (see FIG. 1). The integrated circuit 6 additionally includes switches 13 and 14, a fixed-capacitance capacitor $C_{MD}$, and terminals DPHC and DPHI. The terminals DPHC and DPHI are connected to a resonant circuit.

First of all, as regards the outside of the integrated circuit 6, the other end of the variable-capacitance capacitor VC is not connected to the terminal C1M, but is connected to the terminal DPHC. The variable-capacitance capacitor $VC_{DPH}$ is connected between the terminals DPHC and DPHI.

Next, as regards the inside of the integrated circuit 6, the switch 13 is connected between the terminal C1M and a common terminal of the switch 14. The switch 14 includes a common terminal connected to one end of the switch 13, a first selection terminal connected to the terminal DPHC, and a second selection terminal connected to the terminal DPHI through the fixed-capacitance capacitor $C_{MD}$.

The control circuit 10 has two functions. One function of the control circuit 10 is to control the on/off state of the switch 13 based on a control signal DPHEN1 in response to an instruction from the position detection device. The other function is to control the selection of the switch 14 based on a control signal DPHEN2 in response to an instruction from the position detection device.

The position detection device compatible with the electronic pen 1 according to the present embodiment receives pen information that is transmitted from the electronic pen 1 in accordance with the difference between a first resonant frequency and a second resonant frequency. The first resonant frequency is the resonant frequency of a resonant circuit including the variable-capacitance capacitor VC (a resonant circuit formed of the aforementioned first and second resonant circuits). The second resonant frequency is the resonant frequency of a resonant circuit excluding the variable-capacitance capacitor VC (a resonant circuit formed by removing the variable-capacitance capacitor VC from the first and second resonant circuits).

More specifically, first of all, the position detection device instructs the electronic pen 1 to turn on the switch 13 and connect the switch 14 to the first selection terminal. This instruction may be given, for example, by changing the duration of magnetic field transmission from a sensor coil (not depicted) (refer to Patent Document 2 for details). If the electronic pen 1 and the position detection device support a different communication measure (e.g., Bluetooth (registered trademark) or other measure of short-range wireless communication), such a communication measure may be adopted. This also holds true for the other instructions described later. The resonant frequency detected by the position detection device after the issuance of the above-mentioned instruction is the first resonant frequency, which reflects the pen pressure and the state of the operation switch 4.

Next, the position detection device instructs the electronic pen 1 to turn off the switch 13. The resonant frequency detected by the position detection device after the issuance of the above instruction is the second resonant frequency, which does not reflect the pen pressure.

The position detection device acquires the difference between the first and second resonant frequencies detected as described above, and obtains pen information based on the acquired difference. Therefore, even if the reference resonant frequencies of the first and second resonant circuits, which are equal to the standard values prior to shipment, vary due, for instance, to nearby metal, a temperature change, or aging, the change is offset by acquiring the difference as far as the pen information is obtained in the above manner. This permits the position detection device to properly detect the pen information.

Further, the position detection device compatible with the electronic pen 1 according to the present embodiment changes a pen pressure curve of the electronic pen 1 (a curve indicating the relationship between the pen pressure applied to the nib member 3 and the amount of change in the resonant frequency) in accordance with a user operation.

More specifically, the electronic pen 1 according to the present embodiment supports two different pen pressure curves, namely, a first pen pressure curve and a second pen pressure curve. The first pen pressure curve represents a state where the variable-capacitance capacitor $VC_{DPH}$ and the fixed-capacitance capacitor $C_{MD}$ are disconnected from the first and second resonant circuits. The second pen pressure curve represents a state where the variable-capacitance capacitor $VC_{DPH}$ and the fixed-capacitance capacitor $C_{MD}$ are connected in series with the variable-capacitance capacitor VC. The position detection device selects either the first pen pressure curve or the second pen pressure curve in accordance with a user operation. If the first pen pressure curve is selected, the position detection device instructs the electronic pen 1 to turn on the switch 13 and connect the switch 14 to the first selection terminal. If, by contrast, the second pen pressure curve is selected, the position detection device instructs the electronic pen 1 to turn on the switch 13 and connect the switch 14 to the second selection terminal. In accordance with the instruction from the position detection device, the electronic pen 1 controls the states of the switches 13 and 14. Therefore, the pen pressure curve of the electronic pen 1 can be changed in accordance with a user operation. This makes it possible to choose from two different feels of writing (feels of drawing) with the electronic pen 1.

As described above, the integrated circuit 6 and the electronic pen 1 according to the present embodiment are configured so that the electronic pen 1, which is capable of adjusting the reference resonant frequencies by using a smaller area than when wires are to be cut with a laser, permits the position detection device to properly detect the pen information even when the reference resonant frequencies vary due, for instance, to nearby metal, a temperature change, or aging after completion of adjustment. This also increases the accuracy of pen pressure. As a result, the position detection device is allowed to set a smaller pen pressure threshold value (ON load) for determining whether or not the electronic pen 1 is in contact with the touch surface.

Further, the integrated circuit 6 and the electronic pen 1 according to the present embodiment make it possible to choose from two different feels of writing (feels of drawing) with the electronic pen 1 in accordance with a user operation.

While preferred embodiments of the present disclosure have been described, the present disclosure is not limited to the foregoing embodiments. It will be apparent to those skilled in the art that variations and modifications may be made without departing from the scope and spirit of the present disclosure.

For example, the foregoing embodiments assume that the pen information to be transmitted is based on the displacement of a resonant frequency. However, the present disclosure is also applicable to a case where the pen information is to be transmitted as digital information by turning on and off the supply of a signal to a resonant circuit in accordance with the contents of the pen information. That is, even in the above case, too, the reference resonant frequency of the resonant circuit can be changed by disposing in an integrated circuit a plurality of capacitors connected in parallel with a capacitor included in the resonant circuit and individually changing the capacitance of each of the capacitors or by additionally disposing in the integrated circuit a plurality of switches connected in series with the capacitors and individually controlling the on/off state of each of switches.

What is claimed is:

1. An integrated circuit for use within a stylus, the integrated circuit comprising:
    a first terminal that is connected to a first end of a first capacitor;
    a second terminal that is connected to a second end of the first capacitor;
    a plurality of second capacitors connected between the first and second terminals;
    a power supply terminal connectable to an external device different from the stylus; and
    a control circuit which, in operation, when the power supply terminal is connected with the external device, changes a capacitance of each of the second capacitors by a control signal with power supplied from the external device via the power supply terminal, and, when the power supply terminal is not connected with the external device, the capacitance of each of the second capacitors is not changed by the control signal with power supplied from the external device via the power supply terminal and the second capacitors store electric power for the integrated circuit.

2. The integrated circuit according to claim 1,
    wherein the second capacitors each include a substrate and a floating gate, the floating gate being formed above the substrate, and
    the control circuit, in operation, changes the capacitance of each of the second capacitors by individually injecting electric charge into the floating gate of each of the second capacitors.

3. The integrated circuit according to claim 2, further comprising:
    a plurality of first switches respectively disposed for the second capacitors; and
    a plurality of second switches respectively disposed for the second capacitors,
    wherein the second capacitors each have a laminated structure including:
        the substrate formed of an n-type semiconductor,
        an insulating film,
        the floating gate, and
        a gate electrode.

4. The integrated circuit according to claim 2, further comprising:
    a plurality of first switches respectively disposed for the second capacitors; and
    a plurality of second switches respectively disposed for the second capacitors,
    wherein the second capacitors each have a laminated structure including:
        the substrate formed of a p-type semiconductor,
        an insulating film,
        the floating gate, and
        a gate electrode.

5. The integrated circuit according to claim 3,
    wherein the first switches each include a common terminal, a first selection terminal, and a second selection terminal, the common terminal being connected to the gate electrode of an associated one of the second capacitors, the first selection terminal being connected to the first terminal, the second selection terminal receiving the supply of a relatively high potential;
    the second switches each include a common terminal, a first selection terminal, and a second selection terminal, the common terminal being connected to the substrate of an associated one of the second capacitors, the first selection terminal being connected to the second terminal, the second selection terminal receiving the supply of a relatively low potential; and
    the control circuit, in operation, changes the capacitance of each of the second capacitors by reconnecting an associated one of the first switches to the second selection terminal and reconnecting an associated one of the second switches to the second selection terminal.

6. An electronic pen comprising:
    an integrated circuit including:
        a first terminal that is connected to a first end of a first capacitor,
        a second terminal that is connected to a second end of the first capacitor,
        a plurality of second capacitors connected between the first and second terminals,
        a power supply terminal connectable to an external device different from the electronic pen; and
        a control circuit which, in operation, when the power supply terminal is connected with the external device, changes a capacitance of each of the second capacitors by a control signal with power supplied from the external device via the power supply terminal, and, when the power supply terminal is not connected with the external device, the capacitance of each of the second capacitors is not changed by the control signal with power supplied from the external device via the power supply terminal and the second capacitors store electric power for the integrated circuit,
    wherein the first capacitor includes a variable-capacitance capacitor which, in operation, varies a capacitance of the variable-capacitance capacitor in accordance with pressure applied to a nib of the electronic pen.

7. The electronic pen according to claim 6, further comprising:
    an operation switch that is connected between the second terminal and one end of the variable-capacitance capacitor.

8. An integrated circuit for use within a stylus, the integrated circuit comprising:
    a first terminal that is connected to a first end of a first capacitor;
    a second terminal that is connected to a second end of the first capacitor;
    a plurality of second capacitors connected between the first and second terminals;
    a plurality of switches respectively disposed in series with the second capacitors;
    a power supply terminal connectable to an external device different from the stylus; and
    a control circuit which, in operation, controls an on state and an off state of each of the switches, and, when the power supply terminal is connected with the external device, changes a capacitance of each of the second capacitors by a control signal with power supplied from the external device via the power supply terminal, and, when the power supply terminal is not connected with the external device, the capacitance of each of the second capacitors is not changed by the control signal with power supplied from the external device via the power supply terminal and the second capacitors store electric power for the integrated circuit.

9. The integrated circuit according to claim 8, wherein each of the switches is formed of a fuse element.

10. The integrated circuit according to claim 8, wherein each of the switches is formed of an anti-fuse element.

11. The integrated circuit according to claim 8, wherein each of the switches is formed of a micro electro mechanical systems switch.

12. An electronic pen comprising:
a first capacitor having a capacitance that varies based on pressure applied to a nib of the electronic pen; and
an integrated circuit including:
 a first terminal that is connected to a first end of the first capacitor,
 a second terminal that is connected to a second end of the first capacitor,
 a plurality of second capacitors connected between the first and second terminals,
 a plurality of switches respectively disposed in series with the second capacitors,
 a power supply terminal connectable to an external device different from the electronic pen; and
 a control circuit which, in operation, controls an on state and an off state of each of the switches, and, when the power supply terminal is connected with the external device, changes a capacitance of each of the second capacitors by a control signal with power supplied from the external device via the power supply terminal, and, when the power supply terminal is not connected with the external device, the capacitance of each of the second capacitors is not changed by the control signal with power supplied from the external device via the power supply terminal and the second capacitors store electric power for the integrated circuit.

13. The electronic pen according to claim 12, further comprising:
an operation switch that is connected between the second terminal and one end of the first capacitor.

* * * * *